United States Patent
Malinowski et al.

(10) Patent No.: US 10,546,943 B2
(45) Date of Patent: Jan. 28, 2020

(54) METHODS, APPARATUS, AND SYSTEM FOR REDUCING LEAKAGE CURRENT IN SEMICONDUCTOR DEVICES

(71) Applicant: GLOBALFOUNDRIES INC., Grand Cayman (KY)

(72) Inventors: Arkadiusz Malinowski, Malta, NY (US); Jagar Singh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/960,965

(22) Filed: Apr. 24, 2018

(65) Prior Publication Data

US 2019/0326413 A1 Oct. 24, 2019

(51) Int. Cl.
| | |
|---|---|
| *H01L 29/66* | (2006.01) |
| *H01L 29/08* | (2006.01) |
| *H01L 21/8238* | (2006.01) |
| *H01L 29/78* | (2006.01) |
| H01L 21/265 | (2006.01) |
| H01L 21/3065 | (2006.01) |

(52) U.S. Cl.
CPC ............ *H01L 29/66636* (2013.01); *H01L 21/823814* (2013.01); *H01L 29/0847* (2013.01); *H01L 29/7848* (2013.01); H01L 21/26586 (2013.01); H01L 21/3065 (2013.01)

(58) Field of Classification Search
None
See application file for complete search history.

(56) References Cited

U.S. PATENT DOCUMENTS

| | | | | |
|---|---|---|---|---|
| 6,368,926 B1* | 4/2002 | Wu | ................... | H01L 21/28035 |
| | | | | 438/300 |
| 7,205,206 B2* | 4/2007 | Belyansky | .......... | H01L 29/0653 |
| | | | | 257/E21.546 |
| 7,238,561 B2* | 7/2007 | Zhang | ................... | H01L 29/165 |
| | | | | 257/E21.431 |
| 8,420,459 B1 | 4/2013 | Cheng et al. | | |
| 9,142,651 B1 | 9/2015 | Xie et al. | | |
| 2003/0080361 A1* | 5/2003 | Murthy | ............... | H01L 29/1054 |
| | | | | 257/288 |
| 2004/0137687 A1* | 7/2004 | Feudel | .............. | H01L 21/26506 |
| | | | | 438/302 |
| 2008/0048217 A1* | 2/2008 | Kim | .................... | H01L 29/1045 |
| | | | | 257/288 |
| 2013/0224945 A1 | 8/2013 | Liu et al. | | |
| 2015/0129934 A1 | 5/2015 | Xie et al. | | |

* cited by examiner

*Primary Examiner* — Andres Munoz
(74) *Attorney, Agent, or Firm* — Williams Morgan, P.C.

(57) ABSTRACT

Methods, apparatus, and systems for forming a semiconductor substrate comprising a well region containing a first impurity; forming a gate on the semiconductor substrate above the well region; implanting a second impurity, of a type opposite the first impurity, in the well region on each side of the gate and to a depth above a bottom of the well region, to form two second impurity regions each having a first concentration; removing an upper portion of each second impurity region, to yield two source/drain (S/D) cavities above two depletion regions; and growing epitaxially a doped S/D region in each S/D cavity, wherein each S/D region comprises the second impurity having a second concentration greater than the first concentration.

14 Claims, 6 Drawing Sheets

METHODS, APPARATUS, AND SYSTEM FOR REDUCING LEAKAGE CURRENT IN SEMICONDUCTOR DEVICES

BACKGROUND OF THE INVENTION

Field of the Invention

Generally, the present disclosure relates to the manufacture of sophisticated semiconductor devices, and, more specifically, to various methods and systems for reducing leakage current in semiconductor devices.

Description of the Related Art

The technology explosion in the manufacturing industry has resulted in many new and innovative manufacturing processes. Today's manufacturing processes, particularly semiconductor manufacturing processes, call for a large number of significant steps. These process steps usually require a number of inputs that are generally fine-tuned to maintain proper manufacturing control. These process steps are often used to manufacture various types devices, such as CPU's, storage devices, ASIC's (application specific integrated circuits) and the like, Fabricating these devices requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region.

In contrast to a planar FET, which has a planar structure, there are so-called 3D devices, such as a finFET device, which is a 3-dimensional structure. FinFET semiconductor devices are characterized by the channel of a FET being in a fin disposed on a substrate, the gate of the FET being disposed over the fin, and the source/drain (S/D) regions of the FET are disposed in the substrate, such as in a counter-doped well regions within the substrate. FinFETs are more often utilized from a desire to increase transistor density in semiconductor devices. FinFET structures also offer desirably high gate control. However, FinFET devices may suffer from relatively high junction leakage, i.e., leakage current from S/D regions to the substrate. Relatively high junction leakage is undesirable for applications requiring ultra-low leakage, such as some memory elements. Relatively high junction leakage is also undesirable for applications where low standby power consumption is important, such as many internet-of-things (IOT) applications.

The present disclosure may address and/or at least reduce one or more of the problems identified above.

SUMMARY OF THE INVENTION

The following presents a simplified summary of the disclosure in order to provide a basic understanding of some aspects of the disclosure. This summary is not an exhaustive overview of the disclosure. It is not intended to identify key or critical elements of the disclosure or to delineate the scope of the disclosure. Its sole purpose is to present some concepts in a simplified form as a prelude to the more detailed description that is discussed later.

Generally, the present disclosure is directed to a method, comprising forming a semiconductor substrate comprising a well region containing a first impurity; forming a gate on the semiconductor substrate above the well region; implanting at least one second impurity, of a type opposite the first impurity, in the well region on each side of the gate and to a depth above a bottom of the well region, to form two second impurity regions each having a first impurity concentration; removing an upper portion of each second impurity region, to yield two source/drain (S/D) cavities above two depletion regions; and growing epitaxially a doped S/D region in each S/D cavity, wherein each S/D region comprises at least one third impurity of the same type as the at least one second impurity and having a second impurity concentration greater than the first impurity concentration.

The present disclosure also includes a semiconductor device, comprising a semiconductor substrate; a well region comprising a first impurity and disposed in the semiconductor substrate; a gate on the semiconductor substrate above the well region; two doped S/D regions comprising at least one third impurity and disposed in the semiconductor substrate, one on each side of the gate; and two depletion regions, one below each epitaxial doped S/D region and each comprising at least one second impurity at a concentration below the concentration of the third impurity in the epitaxial doped S/D regions.

The present disclosure also includes a semiconductor device manufacturing system adapted to implement one or more steps of the method.

The present disclosure may provide semiconductor devices with reduced leakage current.

BRIEF DESCRIPTION OF THE DRAWINGS

The disclosure may be understood by reference to the following description taken in conjunction with the accompanying drawings, in which like reference numerals identify like elements, and in which.

Figure 1:
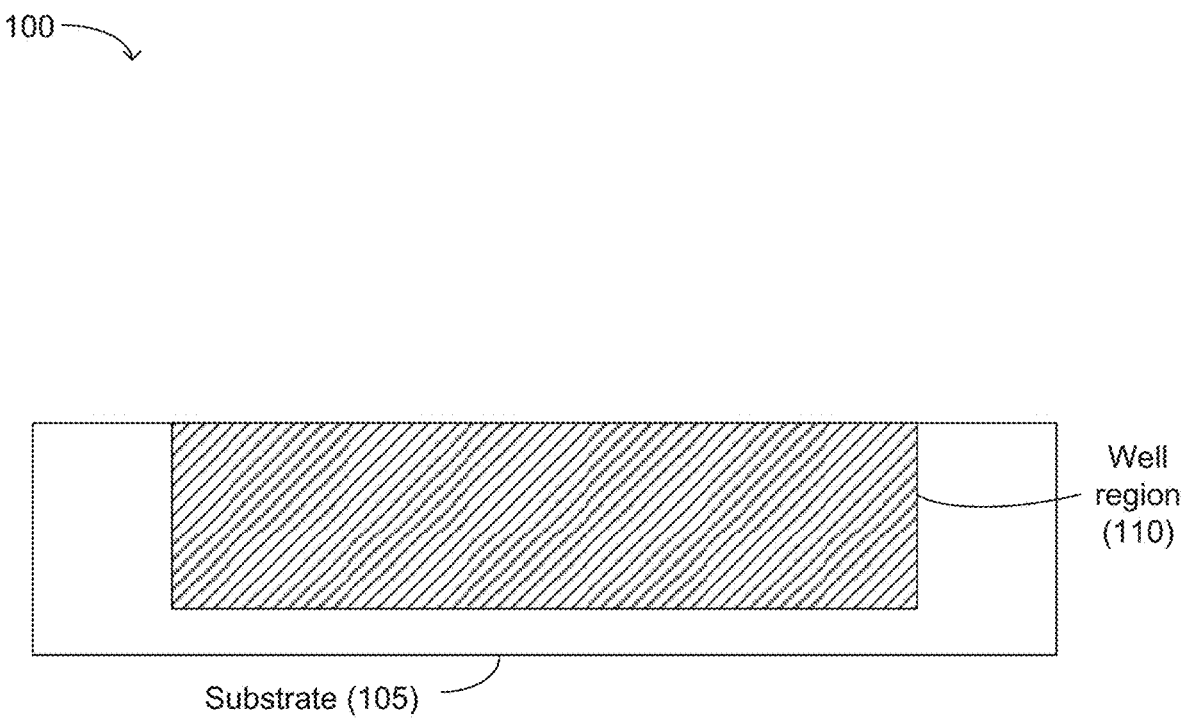
FIG. 1 illustrates a stylized cross-sectional depiction of a semiconductor structure after formation of a well region in a semiconductor substrate, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

DETAILED DESCRIPTION

Various illustrative embodiments of the disclosure are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein are directed to methods of forming a depletion region within a source/drain cavity. The depletion region in the source/drain cavity may provide a region in which reduction and/or substantial cut-off of leakage current. Embodiments herein provide for forming the depletion region using an impurity deposition into the source drain cavity. For example, in a PWELL region, an n-type impurity material may be inserted to provide a local carrier depletion region. The carrier depletion regions of embodiments herein may provide for lowering leakage current and/or increase drive current. Embodiments herein may be implemented for forming memory devices, wherein a programmed bit cell in the memory device may be provided with improved leakage current reduction and/or increased memory access performance. For example, the depletion regions of embodiments herein may provide for reducing the leakage current in a programmed bit cell of a memory device, thereby improving the performance of the memory device.

Turning to FIG. 1, a stylized cross-sectional depiction of a semiconductor structure 100 that may be used as a starting point for one or more methods disclosed herein is presented. The semiconductor structure 100 comprises a substrate 105. The substrate 105 may comprise silicon, silicon-germanium, or other semiconductor materials known to the person of ordinary skill in the art.

Disposed within the substrate 105 is a well region 110. The well region 110 may comprise the same semiconductor material as the substrate 105. The well region 110 also contains a first impurity. The first impurity may be any impurity or dopant that provides a desired type, i.e., p-type or n-type, to the well region 110. In one embodiment, the first impurity may be a dopant known for use in p-well regions.

Figure 2:
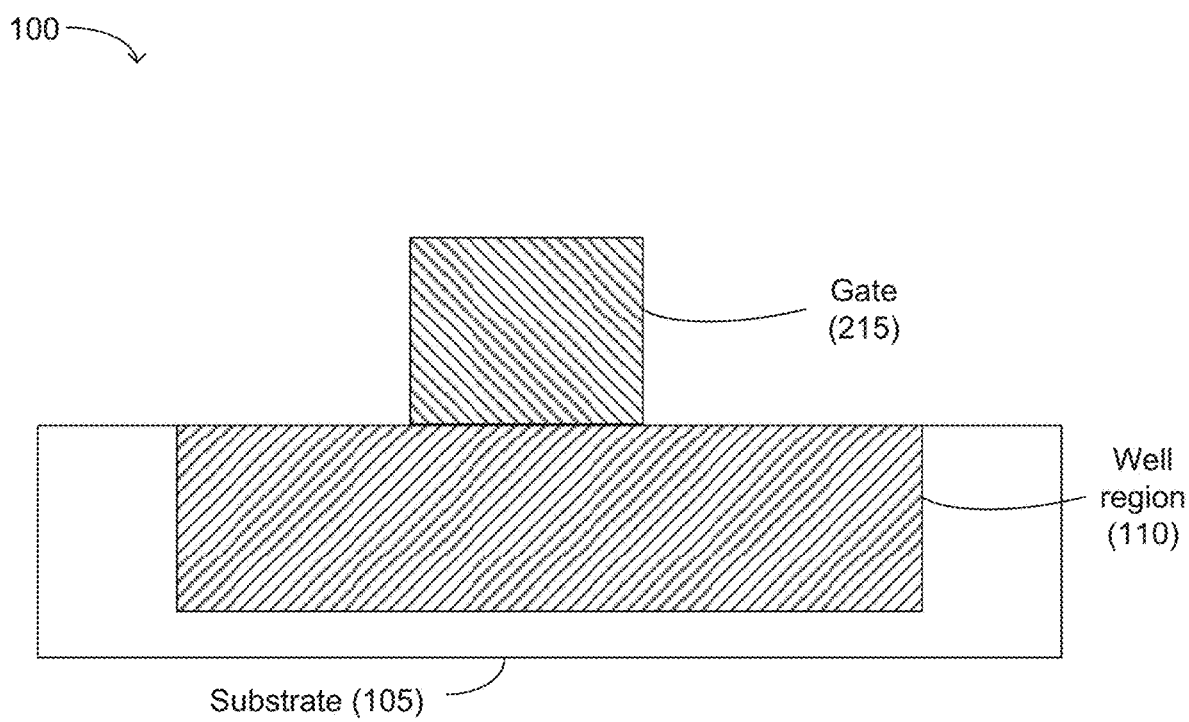
FIG. 2 illustrates a stylized cross-sectional depiction of a semiconductor structure after formation of a gate over the well region, in accordance with embodiments herein.

FIG. 2 depicts a stylized cross-sectional depiction of a semiconductor structure after formation of a gate over the well region, in accordance with embodiments herein. A gate 215 may be formed over the well region 110 by any known process. The term "gate 215" may refer either to a metal gate or to a dummy gate that may be later replaced with a metal gate. In other words, the present disclosure encompasses both "gate-first" and "gate-last" processes. In one embodiment, the gate 215 is a dummy gate. Gate or dummy gate formation processes are known to the person of ordinary skill in the art and need not be described in more detail.

Figure 3A:
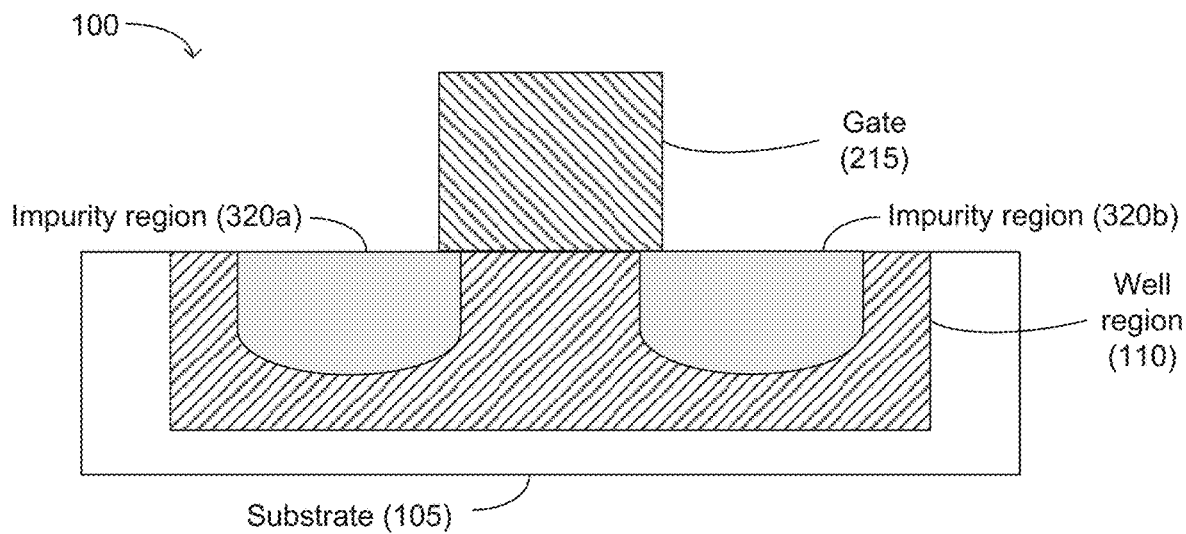
FIG. 3A illustrates a stylized cross-sectional depiction of a semiconductor structure after formation of impurity regions in the well region, in accordance with embodiments herein.
Figure 3B:
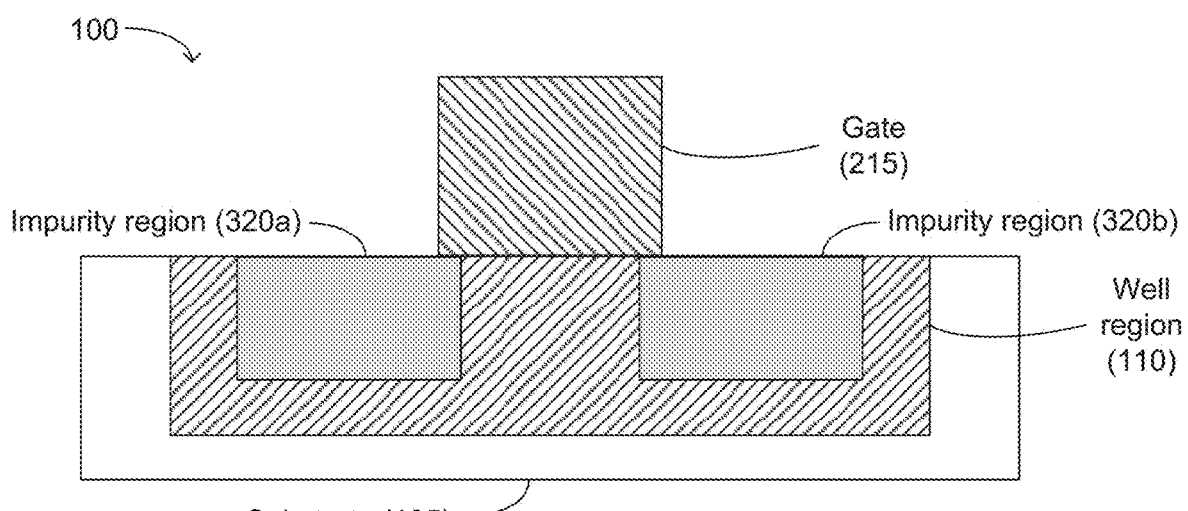
FIG. 3B illustrates a stylized cross-sectional depiction of a semiconductor structure after formation of impurity regions in the well region, in accordance with an alternative embodiment herein.

FIG. 3A illustrates a stylized cross-sectional depiction of a semiconductor structure after formation of impurity regions in the well region, in accordance with embodiments herein. FIG. 3B illustrates a stylized cross-sectional depiction of a semiconductor structure after formation of impurity regions in the well region, in accordance with an alternative embodiment herein. Referring simultaneously to FIGS. 3A and 3B, impurity regions 320a and 320b may be formed by implantation of at least one second impurity in the well region 110 on each side of the gate 215. In one embodiment, the implantation process may include performing an ion implantation process. The implantation process may be performed for a duration and under other conditions to implant the at least one second impurity to a predetermined depth above a bottom of the well region 110. A mask may be used if desired to form second impurity regions 320a and 320b of a desired shape. Alternatively or in addition, an implantation tool may be used to perform one or more twist, tilt, and/or rotation processes on the semiconductor structure 100 to permit implantation of second impurity regions 320a, 320b of a desired shape. Use of an implantation tool for these purposes is a routine matter for the person of ordinary skill in the art having the benefit of the present disclosure. In one embodiment, the implantation process yields two second impurity regions 320a and 320b.

In the second impurity regions 320a and 320b, the at least one second impurity has a type opposite the type of the first impurity. For example, if the first impurity in the well region 110 is a p-type impurity, the at least one second impurity in the second impurity regions 320a, 320b is an n-type impurity. In other embodiments, if the first impurity in the well region 110 is an n-type impurity, the at least one second impurity in the second impurity regions 320a, 320b is a p-type impurity.

The second impurity regions 320a and 320b each have a first concentration of the at least one second impurity.

In one embodiment, implanting the at least one second impurity comprises tilting the semiconductor structure 100, exposing the semiconductor structure 100 to the at least one second impurity in a first direction, rotating the semiconductor structure 100 by 180°, and exposing the semiconductor structure 100 to the at least one second impurity in a second direction. This embodiment may result in the formation of rounded bottoms of the impurity regions 320a, 320b.

In a further embodiment, tilting the semiconductor structure 100 may be an angle of 30°.

In the alternative embodiment shown in FIG. 3B, implanting the at least one second impurity may result in the formation of flat bottoms of the impurity regions 320a, 320b.

Figure 4:
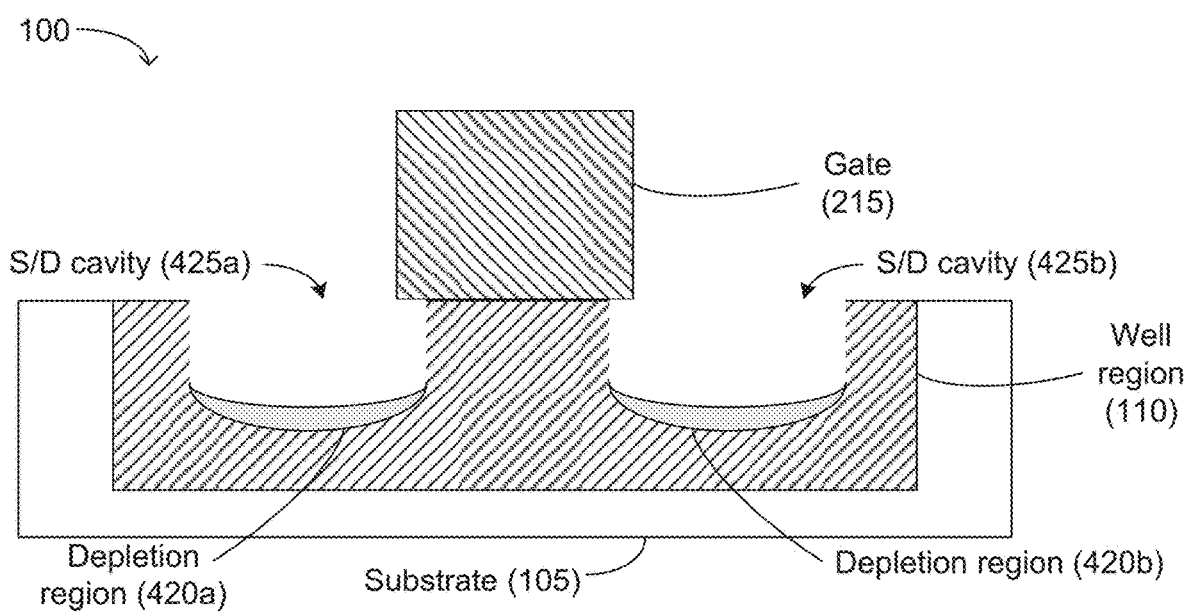
FIG. 4 illustrates a stylized cross-sectional depiction of a semiconductor structure after partial removal of the impurity regions, to form source/drain (S/D) cavities and depletion regions, in accordance with embodiments herein.

FIG. 4 illustrates a stylized cross-sectional depiction of a semiconductor structure after partial removal of the impurity regions, to form source/drain (S/D) cavities and depletion regions, in accordance with embodiments herein. Generally, an upper portion of each second impurity region 320a, 320b may be removed by any appropriate technique. In one embodiment, removing the upper portion of each second impurity region 320a, 320b comprises performing a reactive ion etch (RIE). Regardless of which technique is used to remove the upper portion of each second impurity region 320a, 320b, the technique is performed for a predetermined duration and under conditions sufficient to retain lower, residual portions of the second impurity regions 320a, 320b, referred to in FIG. 4 as depletion regions 420a, 420b, respectively. Above the depletion regions 420a, 420b are yielded two source/drain (S/D) cavities 425a, 425b.

As shown in FIG. 4, each depletion region 420a, 420b may have a crescent cross section.

Figure 5:
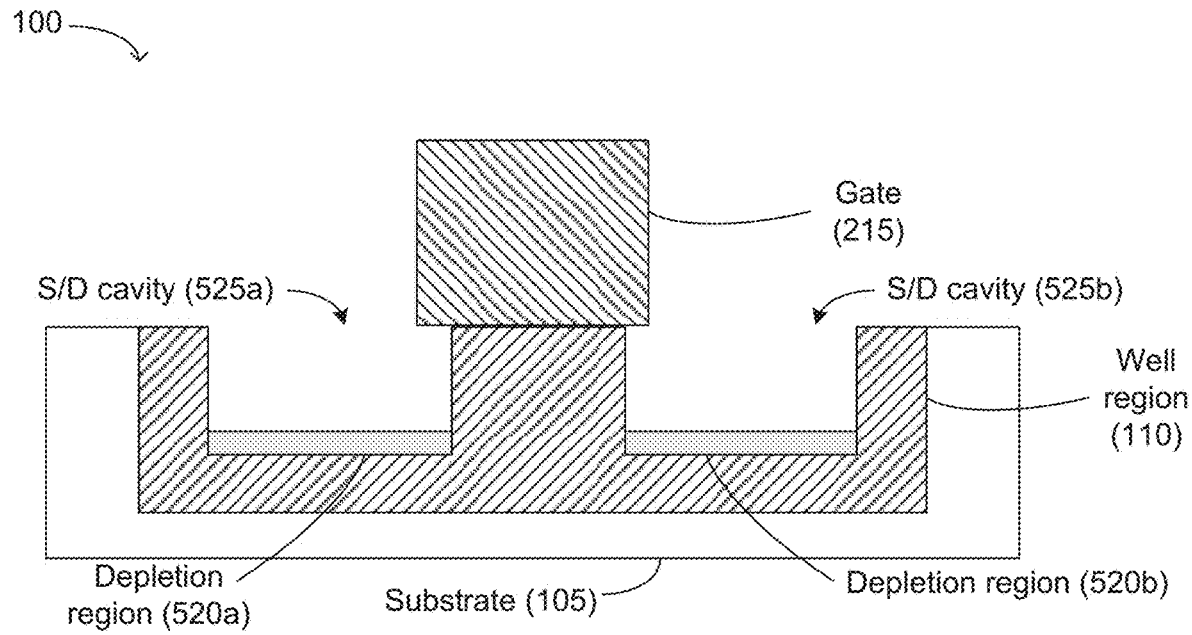
FIG. 5 illustrates a stylized cross-sectional depiction of a semiconductor structure after partial removal of the impurity regions, to form source/drain (S/D) cavities and depletion regions, in accordance with other embodiments herein.

FIG. 5 illustrates a stylized cross-sectional depiction of a semiconductor structure after partial removal of the impurity regions, to form source/drain (S/D) cavities and depletion regions, in accordance with other embodiments herein. FIG. 5 reflects partial removal of second impurity regions having flat bottoms, as described above in an alternative embodiment. The upper portion of each second impurity region 320a, 320b may be removed by a known technique (e.g., an RIE process), which may be performed for a predetermined duration and under conditions sufficient to retain lower, residual portions of the second impurity regions 320a, 320b. The partial removal of second impurity regions having flat bottoms may yield depletion regions 520a, 520b having a rectangular cross section, and S/D cavities 525a, 525b thereabove.

Figure 6:
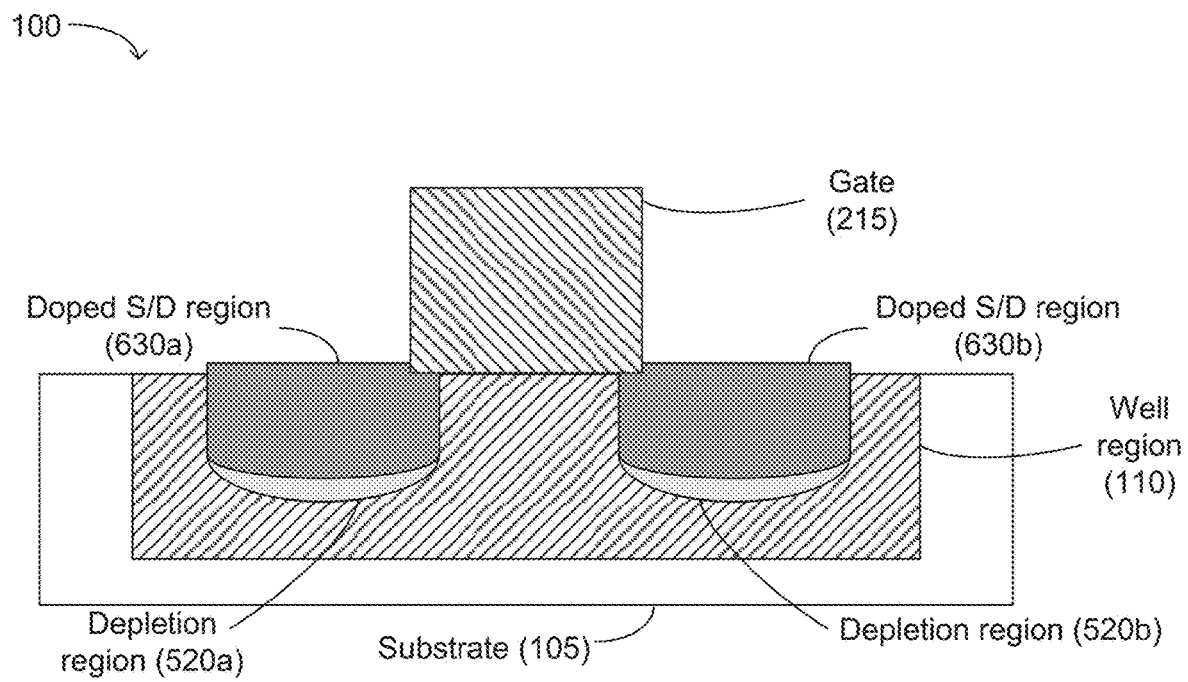
FIG. 6 illustrates a stylized cross-sectional depiction of a semiconductor structure after formation of doped S/D regions, in accordance with embodiments herein.

FIG. 6 illustrates a stylized cross-sectional depiction of a semiconductor structure after formation of doped S/D regions, in accordance with embodiments herein. FIG. 6 may be arrived at by growing epitaxially a doped S/D region, one on each side of the gate, in each S/D cavity 425a, 425b shown in FIG. 4. Doped epitaxial S/D regions 630a, 630b may be formed by known techniques that need not be described further. Each S/D region 630a, 630b is formed such that it comprises at least one third impurity at a second concentration greater than the first concentration.

Though not to be bound by theory, the presence of depletion regions, e.g., depletion regions 520a, 520b, below S/D regions 630a, 630b, respectively, wherein the concentration of the at least one second impurity in the depletion regions is less than the concentration of the at least third impurity in the S/D regions, may reduce leakage from the S/D regions 630a, 630b. Regardless of the shape of the depletion regions 420a, 420b or 520a, 520b, the depletion regions 420a, 420b are essentially not disposed on the sides of the S/D cavities 425a, 425b or the S/D regions 630a, 630b. Though not to be bound by theory, the presence of a depletion region along the sides of an S/D region is believed to degrade device performance.

Figure 7:
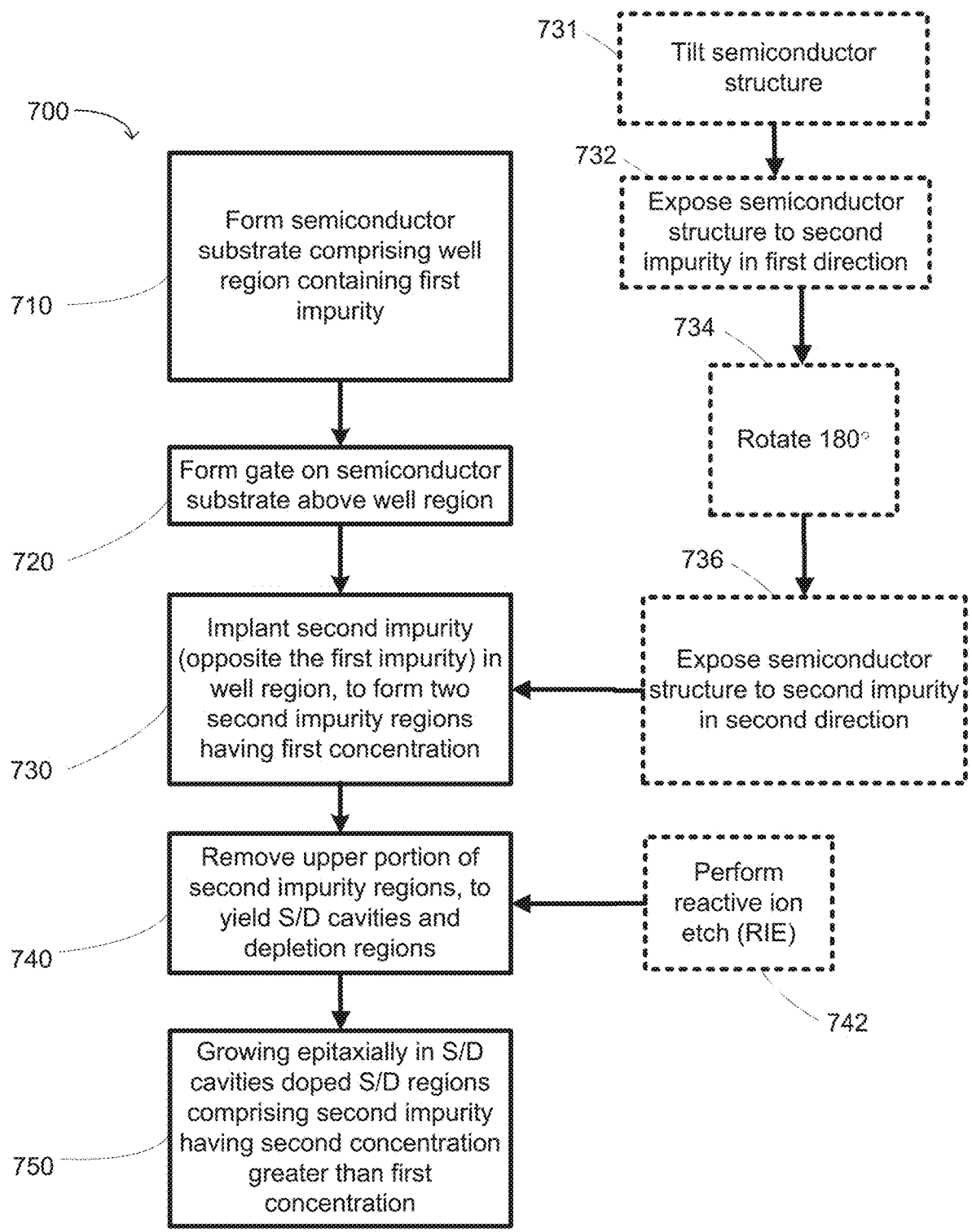
FIG. 7 illustrates a flowchart of a method, in accordance with embodiments herein.

FIG. 7 presents a flowchart of a method 700 in accordance with embodiments herein. The method 700 comprises forming (at 710) a semiconductor substrate comprising a well region containing a first impurity. The method 700 also comprises forming (at 720) a gate on the semiconductor substrate above the well region. The method 700 additionally comprises implanting (at 720) at least one second impurity, of a type opposite the first impurity, in the well region on each side of the gate and to a depth above a bottom of the well region, to form two second impurity regions each having a first concentration.

In one embodiment, implanting (at 730) the second impurity may comprise tilting (at 731) the semiconductor structure, exposing (at 732) the semiconductor structure to the at least one second impurity in a first direction, rotating (at 734) the semiconductor structure 180°, and exposing (at 736) the semiconductor structure to the at least one second impurity in a second direction.

In one embodiment, the first impurity is a p-type impurity and the at least one second impurity is an n-type impurity. In another embodiment, the first impurity is an n-type impurity and the at least one second impurity is a p-type impurity.

Regardless how implanting (at 730) is performed, the method 700 may also involve removing (at 740) an upper portion of each second impurity region, to yield two source/drain (S/D) cavities above two depletion regions. In one embodiment, removing the upper portion of each second impurity region may comprise performing a reactive ion etch (RIE).

In one embodiment, each depletion region may have a crescent cross section. Alternatively, each depletion region may have a rectangular cross section.

The method 700 may additionally comprise growing epitaxially (at 750) a doped S/D region in each S/D cavity, wherein each S/D region comprises at least one third impurity having a second concentration greater than the first concentration. The at least one third impurity is of the same type as the at least one second impurity and is of the opposite type as the first impurity. In an exemplary embodiment, the processes described above may be implemented in forming memory devices. The depletion regions of embodiments herein may provide for reducing leakage current in a programmed bit cell of a memory device, thereby improving the performance of the memory device.

Figure 8:
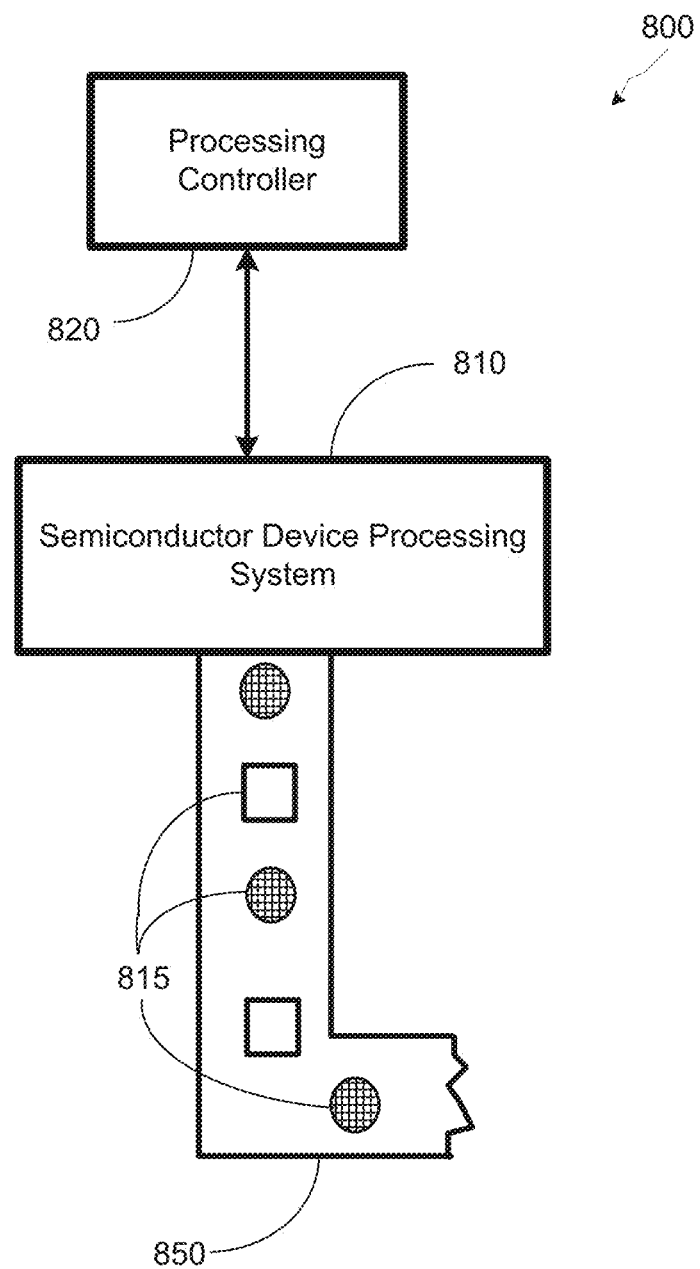
FIG. 8 illustrates a stylized depiction of a system for fabricating a semiconductor device, in accordance with embodiments herein.

Turning now to FIG. 8, a stylized depiction of a system for fabricating a semiconductor device, in accordance with embodiments herein, is illustrated. The system 800 is capable of manufacturing semiconductor devices using the process steps described above.

The semiconductor device processing system 810 may comprise various processing stations, such as etch process stations, photolithography process stations, CMP process stations, etc. One or more of the processing steps performed by the processing system 810 may be controlled by the processing controller 820. The processing controller 820 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 810 may produce integrated circuits on a medium, such as silicon wafers. The processing system 810 may provide processed integrated circuits/devices 815 on a transport mechanism 850, such as a conveyor system. In some embodiments, the conveyor system may be sophisticated clean room transport systems that are capable of transporting semiconductor wafers. In one embodiment, the semiconductor device processing system 810 may perform one or more processing steps, e.g., one or more of those described above and depicted in FIG. 7.

In some embodiments, the items labeled "815" may represent individual wafers, and in other embodiments, the items 815 may represent a group of semiconductor wafers, e.g., a "lot" of semiconductor wafers. The integrated circuit or device 815 may comprise a transistor, a capacitor, a resistor, a memory cell, a processor, and/or the like. In one embodiment, the device 815 includes at least one transistor.

The system 800 may be capable of performing analysis and manufacturing of various products involving various technologies. For example, the system 800 may use design and production data for manufacturing devices of CMOS technology, Flash technology, BiCMOS technology, power devices, memory devices (e.g., DRAM devices), NAND memory devices, and/or various other semiconductor technologies.

The semiconductor device processing system 810 may be adapted to perform one or more of the following:

form a semiconductor substrate comprising a well region containing a first impurity;

form a gate on the semiconductor substrate above the well region;

implant a second impurity, of a type opposite the first impurity, in the well region on each side of the gate and to a depth above a bottom of the well region, to form two second impurity regions each having a first concentration;

remove an upper portion of each of the two second impurity regions, to yield two source/drain (S/D) cavities above two depletion regions; and/or grow epitaxially a doped S/D region in each S/D cavity, wherein each S/D region comprises the second impurity having a second concentration greater than the first concentration.

The semiconductor device processing system 810 may be further adapted to use a p-type impurity as the first impurity and an n-type impurity as the second impurity. Alternatively or in addition, the semiconductor device processing system 810 may be further adapted to use an n-type impurity as the first impurity and a p-type impurity as the second impurity.

The semiconductor device processing system 810 may be further adapted to implant the second impurity by tilting the semiconductor structure, exposing the semiconductor structure to the second impurity in a first direction, rotating the semiconductor structure 180°, and exposing the semiconductor structure to the second impurity in a second direction.

The semiconductor device processing system 810 may be further adapted to form each depletion region to have a crescent cross section. Alternatively or in addition, the semiconductor device processing system 810 may be further adapted to form each depletion region to have a rectangular cross section.

The semiconductor device processing system 810 may be further adapted to remove the upper portion of each second impurity region by performing a reactive ion etch (RIE).

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the disclosure may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the disclosure. Accordingly, the protection sought herein is as set forth in the claims below.

What is claimed is:

1. A method, comprising:
   forming a semiconductor substrate comprising a well region containing a first impurity;
   forming a gate on the semiconductor substrate above the well region;
   implanting at least one second impurity, of a type opposite the first impurity, in the well region on each side of the gate and to a depth above a bottom of the well region, to form two second impurity regions each having a first impurity concentration;
   removing an upper portion of each second impurity region, to yield two source/drain (S/D) cavities above two depletion regions, wherein the two depletion regions are essentially not disposed on sides of the two S/D cavities; and
   growing epitaxially a doped S/D region in each S/D cavity, wherein each doped S/D region comprises at least one third impurity of the same type as the at least one second impurity, wherein each doped S/D region has a second impurity concentration greater than the first impurity concentration.

2. The method of claim 1, wherein the first impurity is a p-type impurity and the at least one second impurity and the at least one third impurity are n-type impurities.

3. The method of claim 1, wherein the first impurity is an n-type impurity and the at least one second impurity and the at least one third impurity are p-type impurities.

4. The method of claim 1, wherein the implanting the at least one second impurity comprises tilting the semiconductor substrate, exposing the semiconductor substrate to the at least one second impurity in a first direction, rotating the semiconductor substrate 180°, and exposing the semiconductor substrate to the at least one second impurity in a second direction.

5. The method of claim 1, wherein each depletion region has a crescent cross section.

6. The method of claim 1, wherein each depletion region has a rectangular cross section.

7. The method of claim 1, wherein removing the upper portion of each second impurity region comprises performing a reactive ion etch (RIE).

8. A system, comprising:
   a semiconductor device processing system to manufacture a semiconductor device; and
   a processing controller operatively coupled to said semiconductor device processing system, said processing controller configured to control an operation of the semiconductor device processing system;

wherein the semiconductor device processing system is adapted to:

form a semiconductor substrate comprising a well region containing a first impurity;

form a gate on the semiconductor substrate above the well region;

implant at least one second impurity, of a type opposite the first impurity, in the well region on each side of the gate and to a depth above a bottom of the well region, to form two second impurity regions each having a first impurity concentration;

remove an upper portion of each of the two second impurity regions, to yield two source/drain (S/D) cavities above two depletion regions, wherein the two depletion regions are essentially not disposed on sides of the two S/D cavities; and grow epitaxially a doped S/D region in each S/D cavity, wherein each S/D region comprises at least one third impurity of the same type as the at least one second impurity, wherein each doped S/D region has a second impurity concentration greater than the first impurity concentration.

9. The system of claim 8, wherein the semiconductor device processing system is adapted to use a p-type impurity as the first impurity and an n-type impurity as the at least one second impurity and the at least one third impurity.

10. The system of claim 8, wherein the semiconductor device processing system is adapted to use an n-type impurity as the first impurity and a p-type impurity as the at least one second impurity and the at least one third impurity.

11. The system of claim 8, wherein the semiconductor device processing system is adapted to implant the at least one second impurity by tilting the semiconductor substrate, exposing the semiconductor substrate to the at least one second impurity in a first direction, rotating the semiconductor substrate 180°, and exposing the semiconductor substrate to the at least one second impurity in a second direction.

12. The system of claim 8, wherein the semiconductor device processing system is adapted to form each depletion region to have a crescent cross section.

13. The system of claim 8, wherein the semiconductor device processing system is adapted to form each depletion region to have a rectangular cross section.

14. The system of claim 8, wherein the semiconductor device processing system is adapted to remove the upper portion of each second impurity region by performing a reactive ion etch (RIE).

* * * * *